United States Patent
Zettel et al.

(10) Patent No.: US 6,555,991 B1
(45) Date of Patent: Apr. 29, 2003

(54) BATTERY OPERATING CONDITION DEPENDENT METHOD AND APPARATUS FOR CONTROLLING ENERGY TRANSFER BETWEEN AN ENERGY BUS AND A SYSTEM OF BATTERIES

(76) Inventors: Andrew Michael Zettel, 607-2201 Pine Street, Vancouver, British Columbia (CA), V6J 5E7; Nicolas Louis Bouchon, 3007-939 Homer Street, Vancouver, British Columbia (CA), V6B 2W6

(*) Notice: Subject to any disclaimer, the term of this patent is extended or adjusted under 35 U.S.C. 154(b) by 0 days.

(21) Appl. No.: 10/062,452

(22) Filed: Feb. 5, 2002

(51) Int. Cl.[7] .................. H02J 7/00; G01R 31/36
(52) U.S. Cl. ............................. 320/137; 702/63
(58) Field of Search ..................... 320/116, 122, 320/137, 162, 134, 132, 149, 150, 124, FOR 105, FOR 106, FOR 114, FOR 115, FOR 116, FOR 117, FOR 131, FOR 138, FOR 142; 700/293; 702/63

(56) References Cited

U.S. PATENT DOCUMENTS

| | | | |
|---|---|---|---|
| 5,869,950 A | 2/1999 | Hoffman, Jr. et al. ...... 320/103 |
| 5,932,990 A | 8/1999 | Kaneko ....................... 320/122 |
| 5,945,808 A | 8/1999 | Kikuchi et al. .............. 320/132 |
| 5,952,815 A | * 9/1999 | Rouillard et al. ........... 320/116 |
| 5,998,972 A | * 12/1999 | Gong ........................ 320/134 |
| 6,104,967 A | * 8/2000 | Hagen ........................ 700/293 |
| 6,362,602 B1 | * 5/2001 | Kozarekar ................... 320/132 |
| 6,262,561 B1 | 7/2001 | Takahashi et al. .......... 320/104 |
| 6,271,645 B1 | 8/2001 | Schneider et al. .......... 320/118 |
| 6,271,647 B2 | 8/2001 | Galbraith et al. ............ 320/132 |

* cited by examiner

Primary Examiner—Michael Sherry
Assistant Examiner—Pia Tibbits

(57) ABSTRACT

Apparatus, method, media and signals for controlling energy transfer between an energy bus and a system of batteries, in which a control signal generator operable to receive an extreme voltage representation representing a voltage of a battery exhibiting an extreme voltage among voltages of all batteries in the system, and a representation of a reference voltage derived from an operating parameter associated with the battery exhibiting the extreme voltage, is operable to produce a control signal for use in changing the amount of energy transfer between the energy bus and the system in response to the aforementioned representations.

55 Claims, 7 Drawing Sheets

BATTERY OPERATING CONDITION DEPENDENT METHOD AND APPARATUS FOR CONTROLLING ENERGY TRANSFER BETWEEN AN ENERGY BUS AND A SYSTEM OF BATTERIES

BACKGROUND OF THE INVENTION

1. Field of Invention

This invention relates to battery power systems and more particularly to apparatus, methods, media and signals for controlling energy transfer between an energy bus and a system of batteries.

2. Description of Related Art

With the increasing interest in electric vehicles, hybrid electric vehicles and use of battery back-up systems, the need for battery power systems is similarly increasing. Many applications require the use of a series string of rechargeable batteries. The ability of any individual battery in such a string to accept a load or to accept a charge current depends on the individual battery. Various factors affect the ability of a battery to receive or deliver charge and such factors may include operating conditions of the battery such as temperature and state of charge, for example. Other factors such as storage time, float voltage, float life, minimum voltage, number of cycles, depth of discharge and capacity also play a role. Consequently, the operating conditions of each individual battery affect the ability of the entire battery system to deliver or receive charge.

Most systems that deliver or receive charge from a battery system treat the battery system as a single source supply where voltage and current demands or impositions on the battery system are calculated for the performance of the system as a whole. Some systems monitor voltages at each battery and adjust the overall system voltage or current based on differences in voltage so as not to place excessive strain on any given battery. Voltage, however, is a very crude and inaccurate measure of a battery's ability to deliver or receive charge and thus, provides only limited information with which to control the overall system, resulting in somewhat inefficient operation of the battery system.

Thus, there is a need for efficient management of energy flow to and from a battery system. More accurate control of load and charging current is needed to maximize energy efficiency.

SUMMARY OF THE INVENTION

The present invention addresses the above need by providing an apparatus, method, media and signal for controlling energy transfer between an energy bus and a system of batteries, in which a control signal generator operable to receive an extreme voltage representation representing a voltage of a battery exhibiting an extreme voltage among voltages of all batteries in the system, and a representation of a reference voltage derived from an operating parameter associated with the battery exhibiting the extreme voltage, is operable to produce a control signal for use in changing the amount of energy transfer between the energy bus and the battery system in response to the aforementioned representations. The control signal may be used by a load/charging device such as a motor/generator to control the flow of energy from and to the system of batteries.

Effectively, using the system and methods described above, the voltage of any given battery relative to the voltage of other batteries in the battery system determines whether or not a battery is selected for more careful analysis based on an operating parameter of that battery. This operating parameter may be used to determine a reference voltage which is used in conjunction with the voltage of the selected battery to produce a control signal such as a current change signal and/or a voltage change signal. Thus, a battery's relative voltage performance is used to invoke an investigation of its operating conditions to determine how best to adjust the charge or discharge current or more generally to adjust the energy flowing to or from the battery system as a whole.

In accordance with one aspect of the invention, there is provided an apparatus for controlling energy transfer between an energy bus and a system of batteries. The apparatus includes an accessor operable to access an extreme voltage representation representing a voltage of a battery exhibiting an extreme voltage among voltages of all batteries in the system and operable to access a representation of a reference voltage derived from an operating parameter associated with the battery exhibiting the extreme voltage. The apparatus also includes a control signal generator in communication with the accessor and operable to produce a control signal for use in changing the amount of energy transfer between the energy bus and the system in response to the representation of a reference voltage and the representation of the voltage extremity.

The apparatus may include a voltage extremity processor operable to produce the representation of the voltage extremity and may include memory accessible by the voltage extremity processor, for receiving and storing representations of voltages of batteries in the system. The voltage extremity processor may be configured to determine which of the representations represents the extreme voltage, and this may be done by employing a sorter to sort the representations of voltages.

The apparatus may further comprise a reference voltage processor operable to produce the representation of the reference voltage. This reference voltage processor may be operable to receive a representation of an operating parameter such as temperature of the battery exhibiting the extreme voltage. The reference voltage processor may have a look-up table interface operable to employ the temperature representation as an index to a look-up table relating reference voltages to temperature. The particular look-up table used may be selected as a function of state of charge of the battery having the extreme voltage. The look-up table interface may include an input operable to receive a representation of state of charge, for example, or the apparatus may include a state of charge processor operable to produce a representation of state of charge.

The look-up table interface may be able to employ the temperature representation as an index to a look-up table relating optimal charging voltages to temperature and/or a look-up table relating lowest permissible battery voltages to temperature, for example.

The apparatus may further comprise memory for receiving and storing a representation of voltage and a representation of temperature for each battery in the system and alternatively or in addition, the apparatus may include a device for producing the representation of voltage and the representation of temperature for each battery in the system.

The apparatus may employ an associator operable to associate respective voltage and temperature representations with corresponding batteries.

The apparatus may include a selector operable to select, as the temperature representation for use by the reference voltage processor, a temperature representation associated with a battery with which the extreme voltage is associated.

The control signal generator may have a difference processor operable to find a mathematical difference between the reference voltage and the extreme voltage and may be operable to produce a current change value indicative of a change in current available from the system of batteries and/or it may be operable to produce a voltage change value indicative of a desired change in voltage to be applied to the system of batteries. In addition, the control signal generator may be operable to produce a target bus voltage as a function of a previous target bus voltage and the voltage change value.

The apparatus may include an energy flow determiner operable to determine whether or not energy transfer is to the energy bus or to the battery system. The energy flow determiner may cooperate with the control signal generator or may be integrated therein, for example, to cause the control signal generator to produce a current change signal when energy is flowing to the bus and to produce a voltage change signal when energy is flowing to the battery system.

The apparatus may also include a bypass controller operable to produce a bypass activation signal for activating a bypass circuit on any battery having a voltage greater than a reference value, when there is no change in the direction of current flow through the battery system. The bypass controller may also produce a bypass circuit de-activation signal for de-activating a bypass circuit on any battery having an activated bypass circuit when there is a change in the direction of current flow in the system unless any battery has a voltage greater than the reference value.

In accordance with another aspect of the invention, there is provided a method of optimizing energy transfer between a system of storage batteries and an energy bus, the method comprising producing a control signal for use in changing the amount of energy transfer between the energy bus and the system of batteries in response to a representation of a reference voltage determined from an operating parameter of a battery exhibiting a voltage extremity and a representation of the voltage extremity.

In accordance with another aspect of the invention, there is provided a computer readable medium for providing codes for directing a processor circuit to control energy transfer between an energy bus and a system of batteries by producing a control signal for changing the amount of energy transfer between the energy bus and the system of batteries in response to a representation of a reference voltage determined from an operating parameter of a battery exhibiting a voltage extremity and a representation of the voltage extremity.

In accordance with another aspect of the invention, there is provided a signal comprising a segment providing codes for directing a processor circuit to control energy transfer between an energy bus and a system of batteries, the codes including codes for directing the processor circuit to produce a control signal for use in changing the amount of energy transfer between the energy bus and the system of batteries in response to a representation of a reference voltage determined from an operating parameter of a battery exhibiting a voltage extremity and a representation of such voltage extremity.

Other aspects and features of the present invention will become apparent to those ordinarily skilled in the art upon review of the following description of specific embodiments of the invention in conjunction with the accompanying Figures.

BRIEF DESCRIPTION OF THE DRAWINGS

In drawings which illustrate embodiments of the invention.

DETAILED DESCRIPTION

Figure 1:
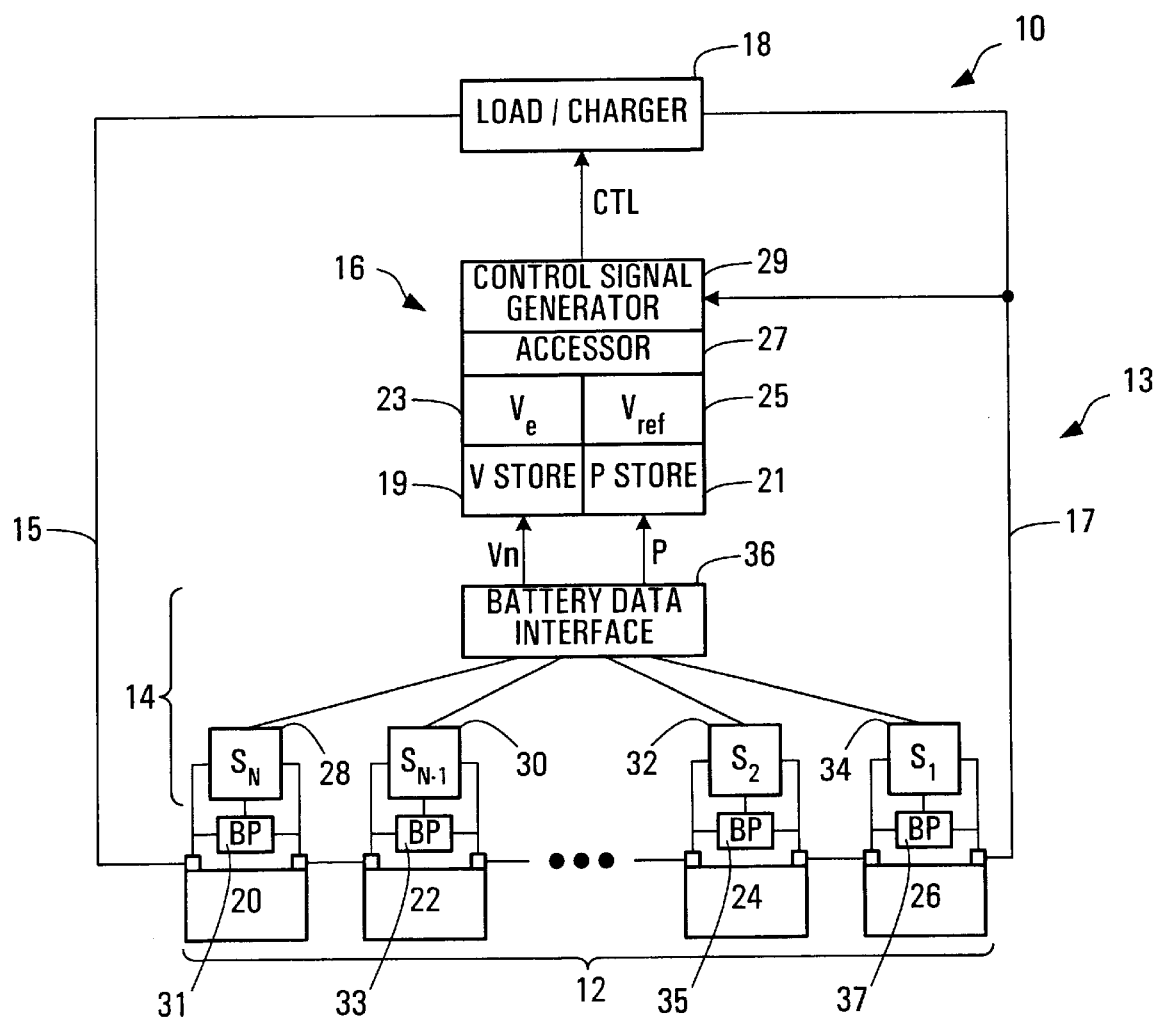
FIG. 1 is a schematic representation of a system employing an apparatus according to first embodiment of the invention.

Referring to FIG. 1, a generic battery-powered power system according to a first embodiment of the invention is shown generally at 10. This power system 10 may be used in an electric vehicle, a hybrid electric vehicle, a stationary power back-up system or the like. Generally, the power system 10 involves a system of batteries shown generally at 12 connected to an energy bus 13 which may include high current capacity cables 15 and 17 for example, connected to a load/charger device 18. The system of batteries 12 may include a series string of rechargeable batteries such as lead acid or gel cell batteries, for example. The lead acid batteries may be valve regulated lead acid (VRLA) batteries, for example.

Where the power system 10 is used in an electric vehicle, the load/charger device 18 may be a combination controller/motor/generator unit capable of receiving data words representing control parameters for adjusting field current of the motor/generator to control the amount of power drawn or provided to the battery system 12. The controller of the combination may be a programmable inverter/charger, for example which may be connected to a motor/generator unit to supply current thereto and receive current therefrom. For example, the controller may be of the type available from Ecostar Electric Drive Systems of Dearborn, Mich., USA for use in electric drive systems for automotive and stationary power applications. The motor generator unit may be of the type available from UQM Technologies, Inc. of Golden, Colo., USA.

In general, the system of batteries 12 may operate in a supply mode to supply or transfer energy to the energy bus 13 for conduction to the load/charger device 18 or the battery system 12 may operate in a charge mode in which the system of batteries receives energy from the energy bus, the energy being supplied by the load/charger device 18.

The power system 10 further includes a battery data acquisition system shown generally at 14, and a controller shown generally at 16. Generally, the battery data acquisition system 14 produces a representation of voltage and a representation of a battery operating parameter such as temperature, for each battery in the battery system 12 and it may also provide a measure of the magnitude and direction of current flow on the energy bus 13.

The data acquisition system 14 may include a plurality of sensor units 28, 30, 32, and 34, for example, each sensor unit being associated with a respective corresponding battery 20, 22, 24 and 26. The data acquisition system 14 may further include a battery data interface shown generally at 36.

The sensor units may be of the type available from eXtend Computer & Instrument Inc. of Michigan, U.S.A., for example. Generally, these sensor units 28, 30, 32 and 34 are operable to measure voltage across respective batteries 20 to 26 and include sensors for measuring an operating parameter of each respective battery. In this embodiment, the operating parameter sensed by the sensors is case temperature of the battery.

Measured data obtained by the sensors is transmitted by corresponding sensor units over an isolated, single wire digital network, to the battery data interface 36. Each sensor unit draws its operating power from the system of batteries to which it is connected. Measurement of battery data may be invoked at a selected sensor unit, in response to receiving a command transmitted on the digital network from the battery data interface 36.

In this embodiment, each sensor unit 28, 30, 32 and 34 has a built-in bypass circuit 31, 33, 35 and 37, respectively, which, as will be explained below, can be used to continually balance/equalize batteries within the battery system 12. Control of the bypass circuits 31, 33, 35 and 37 is provided by signals received over the same single wire digital network used to receive commands from and transmit measured data to the battery data interface 36.

In this embodiment the battery data interface 36 is of the type supplied by extend Computer & Instrument, Inc. of Michigan USA. This interface 36 may have a serial or parallel communications port through which communications with the controller 16 may be effected. The battery data interface 36 also has a terminal for connection to the single wire digital network to which the battery sensor units 28, 30, 32, and 34 are connected, for bi-directional communication with the battery sensor units. The battery data interface 36 may also have a current sensor input operable to be used with a current shunt (not shown) to acquire information relating to the magnitude of current flow and direction on the energy bus 13.

The battery data interface 36 is operable to be controlled by the controller 16 such that the controller can communicate with the battery data interface to send a request for information and receive the requested information in response, or to control the bypass circuits 31, 33, 35 and 37 of certain sensor units 28, 30, 32 and 34, respectively. Such communications are effected by sending a command message or messages from the controller 16 to the battery data interface 36. In response, the battery data interface 36 interprets the command message and communicates with one or more individual sensor units 28, 30, 32 or 34 to control it or acquire any requested information and sends back a response message to the controller 16 with the requested information or an indication of the status of the sensor unit. Requested information may include voltage and operating condition such as temperature of any battery of the battery system 12 and the magnitude and direction of current flow in the battery system, for example.

It will be appreciated that every battery 20, 22 24 and 26 in the battery system 12 may operate at a different voltage, depending upon various factors such as operating conditions and state of charge, for example. Some batteries will have higher voltages relative to others while other batteries will have lower voltages relative to others. Usually, one battery will have a higher voltage than all the rest and one battery will have a lower voltage than all the rest. This higher voltage and this lower voltage may be referred to as voltage extremities, or extreme voltages among the voltages of all of the batteries in the battery system 12. The battery with the lowest voltage is, of course, the battery with the low voltage extreme while the battery with the highest voltage is the battery with the high voltage extreme. In accordance with the invention claimed herein, these voltage extremes are important in determining how to control energy flow to and from the energy bus 13, depending upon the direction of energy flow on the energy bus, as will be appreciated below.

In general, the controller 16 is operable to receive from the data acquisition system 14 representations of voltage and representations of at least one operating parameter for each battery and is operable to store these representations in respective arrays 19 and 21. The representations may be in the form of data "words" or "bytes", for example.

In this embodiment, the controller 16 has functional blocks 23 and 25 that act as a voltage extremity processor and a reference voltage processor respectively that operate on the voltage and operating parameter representations to produce an extreme voltage representation representing the voltage of the battery exhibiting an extreme voltage and to produce a representation of a reference voltage derived from an operating parameter associated with the battery exhibiting the extreme voltage. This extreme voltage representation and reference voltage representation are received in respective memory locations. The controller further includes an accessor 27 that accesses the extreme voltage representation and the reference voltage representation and passes them to a control signal generator 29 that produces a control signal for use by the load/charger device 18, in changing the amount of energy transfer between the energy bus and the battery system 12 in response to the representation of the voltage extremity and the representation of the reference voltage.

The controller 16 may be implemented by discrete components or more preferably by a processor circuit such as a programmable controller, for example.

Figure 2:
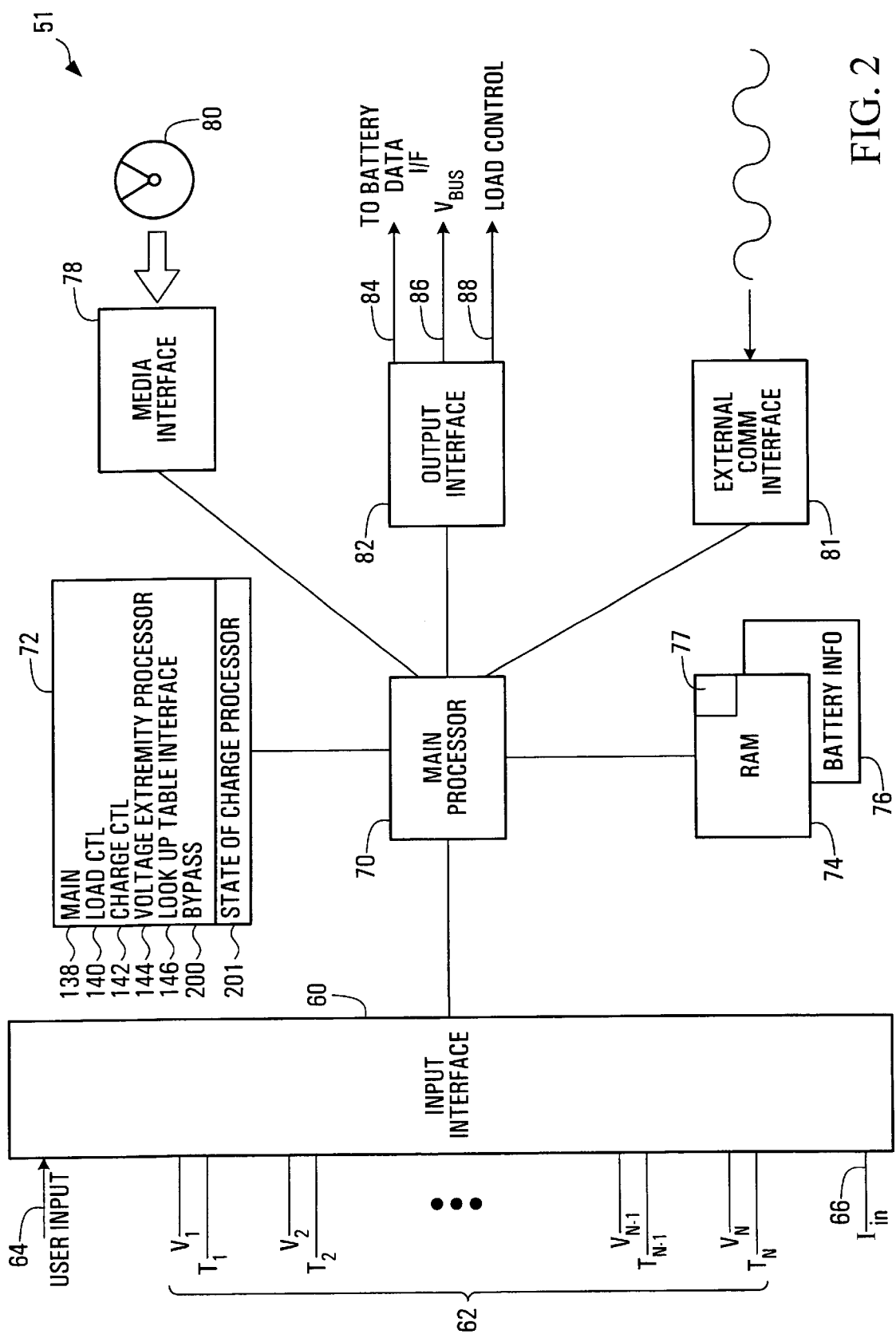
FIG. 2 is a block diagram of a processor circuit of the apparatus shown in FIG. 1.

Referring to FIGS. 1 and 2, a suitable processor circuit for use as the controller 16 is shown generally at 51. In this embodiment, the processor circuit 51 includes an input interface 60 having inputs shown generally at 62 for receiving voltage and operating parameter values for each respective battery in the battery system 12. In the embodiment shown, the input interface 60 is seen to have a separate pair of inputs for each battery but it will be appreciated that voltage and operating parameter information may be received serially from the data acquisition system, in which case there may be a single input for receiving voltage and temperature values for each battery, for example. For illustrative purposes, the input interface 60 also includes a user input 64 for receiving user information and also includes a current input 66 for receiving a value indicative of the direction and magnitude of current flowing in the system, such as described above, from the data acquisition system 14. Alternatively, the current value may be derived from a current transformer on one of the supply conductors from the battery system to the load/charger, for example.

The processor circuit 51 further includes a main processor circuit 70, program memory 72, random access memory (RAM) 74 and battery information non-volatile memory 76. In this embodiment, the battery information non-volatile memory 76 is operable to store tables 77 representing optimal charging voltage vs. temperature and lowest permissible battery voltage vs. temperature and may further store tables representing storage time vs. temperature, float voltage vs. temperature, minimum voltage vs. state of charge, cycles to failure vs. percent depth of discharge and battery capacity tables of percent capacity vs. temperature, for example. This information may be inputted into the battery information non-volatile memory 76 by the user or may be pre-stored in this memory to provide libraries of the above-mentioned tables for a plurality of different types of batteries, for example. Then, on receiving user input identifying the type of battery with which the controller 16 is to be used, the appropriate library of tables may be selected and activated for use in producing the control signal.

In this embodiment, the main processor circuit 70 is also in communication with a media interface 78 operable to read a computer readable medium such as a CD-ROM 80, for example. The CD-ROM 80 may provide the above-mentioned libraries of information for each type of battery, for example, and/or may provide codes operable to be stored in the program memory 72 defining functions executed by the main processor circuit 70 for producing the control 15 signal, in accordance with an embodiment of a method according to the invention.

In addition, in the embodiment shown, the main processor circuit 70 is in communication with an external communications interface 81 operable to provide for communications on a network, for example, and such network may include the internet, for example. Thus, the external communications interface 81 may provide for receipt of library information mentioned above via the internet or may be operable to receive programs as mentioned above in a computer data signal received from the internet, for storage in the program memory 72.

The main processor circuit 70 is further in communication with an output interface 82 which has an output 84 for providing signals to the battery data interface 36 shown in FIG. 1 to cause the battery data interface to sample or interrogate the sensor units 28 to 34 shown in FIG. 1 to acquire voltage and operating parameter information which will ultimately be received at the input interface 60, shown in FIG. 2. In addition, the output interface 82 provides the control signal for use in changing the amount of energy transfer between the energy bus 13 and the battery system 12 in response to the representation of a reference voltage and the representation of the voltage extremity. This control signal may appear at an output 86 in the form of a target bus voltage control signal for controlling bus voltage during the charging mode and/or may appear as an output 88 in the form of a current change control signal for controlling current in the system during the supply mode. It will be appreciated that the output interface 82 may alternatively provide a single output in place of outputs 86 and 88 for issuing commands identifying whether the output signal represents the target bus voltage signal and/or the current change control signal, as the control signal for controlling the load/charger charger 18 shown in FIG. 1, the commands also including these signals.

Figure 3:
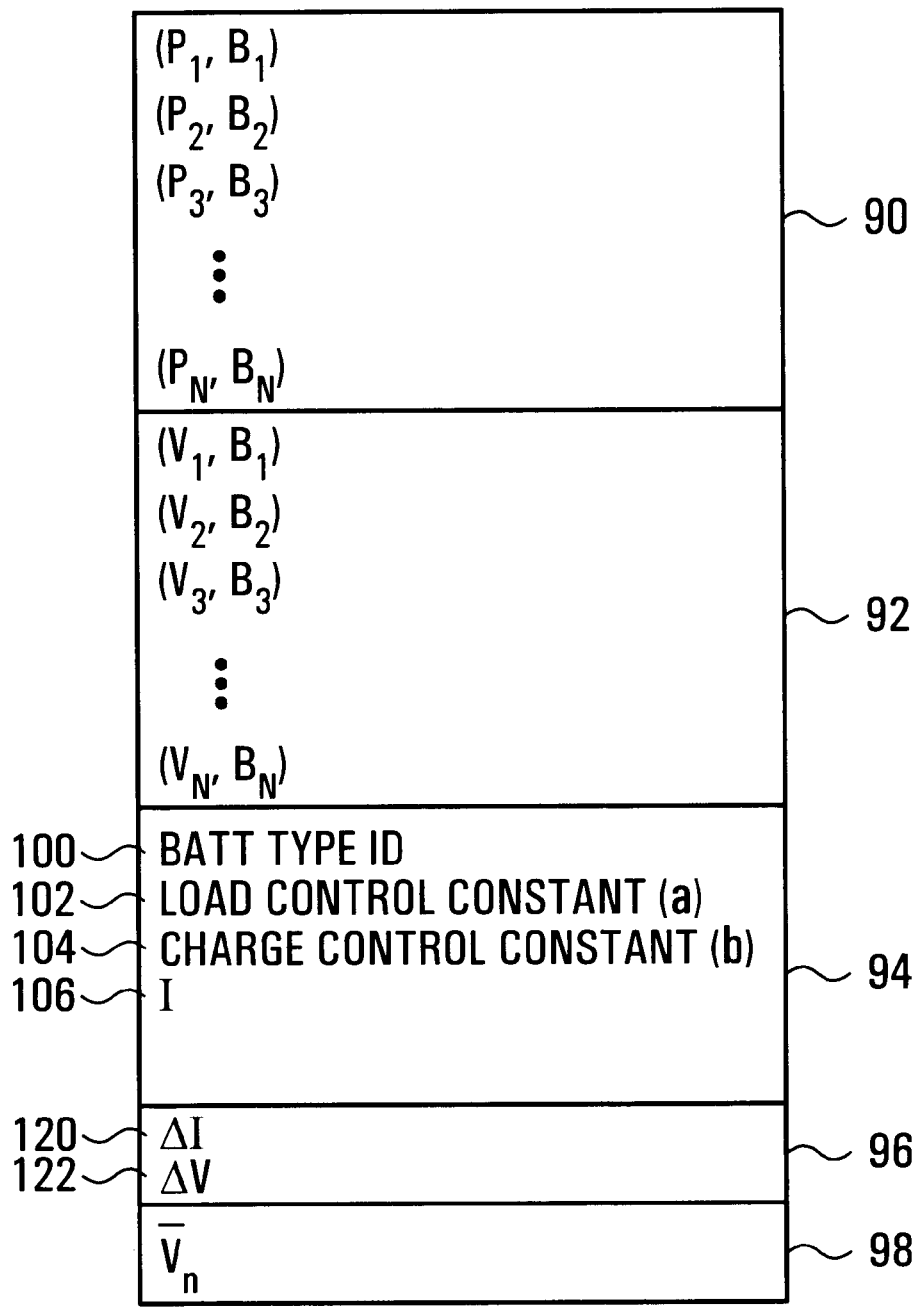
FIG. 3 is a schematic representation of a data structure formed in a random access memory of the processor circuit shown in FIG. 2.

Referring to FIG. 3, the random access memory (RAM) 74 may be arranged to include an operating parameter array 90, a voltage parameter array 92, a control parameter array 94 and an output parameter array 96. The RAM 74 may also include a reference value field 98.

In general, the operating parameter array 90 and the voltage parameter array store a representation of operating parameter (such as temperature) and a representation of voltage, respectively, for each battery in the battery system 12.

The operating parameter array 90 may store number pairs representing an operating parameter and battery identification respectively. Thus, when the operating parameter array 90 is loaded with data, given any battery identification, the corresponding operating parameter can be obtained. Similarly, the voltage parameter array 92 stores number pairs representing voltage and battery identification. Thus, given a voltage value, a corresponding battery may be identified. As will be more fully explained below, when both arrays are loaded, the main processor circuit 70 uses a given voltage value to find the operating parameter representation associated with the battery associated with the given voltage value.

The operating parameter array includes a battery type id field 100, a load control constant field 102, a charge control constant field 104, and a current direction field 106. The battery type id field 100 may be loaded with information received from the user, such as an indication of the type of batteries in the battery system 12. The load control constant field 102 and charge control constant field 104 hold fixed values dependent upon the type of batteries employed in the battery system 12. The current direction field 106 stores a value received from the battery data acquisition system 14 shown in FIG. 1, representing current direction on the energy bus 13.

The output parameter array 96 may include a current change output value field 120 and a voltage change output value field 122, which may act as representations of the output signal produced by the signal generator.

Referring to FIGS. 1 and 2, the program memory 72 is programmed with blocks of codes 138, 140, 142, 144, 146 and 200, which direct the main processor circuit 70 to execute functional blocks that implement a set of routines including a main routine, a load control routine, a charge control routine, a voltage extremity processor routine, a lookup table interface and a bypass routine respectively. Various subsets of this set of routines cooperate to act as the voltage extremity processor 23, the reference voltage processor 25, the accessor 27 and the control signal generator 29, shown in FIG. 1. The program memory 72 may include further sets of codes (not shown) for establishing communications with the battery data interface 36 shown in FIG. 1 and for executing various functions for interfacing with the media interface 78, and the external communications interface 81, for example.

Figures 4, 5:
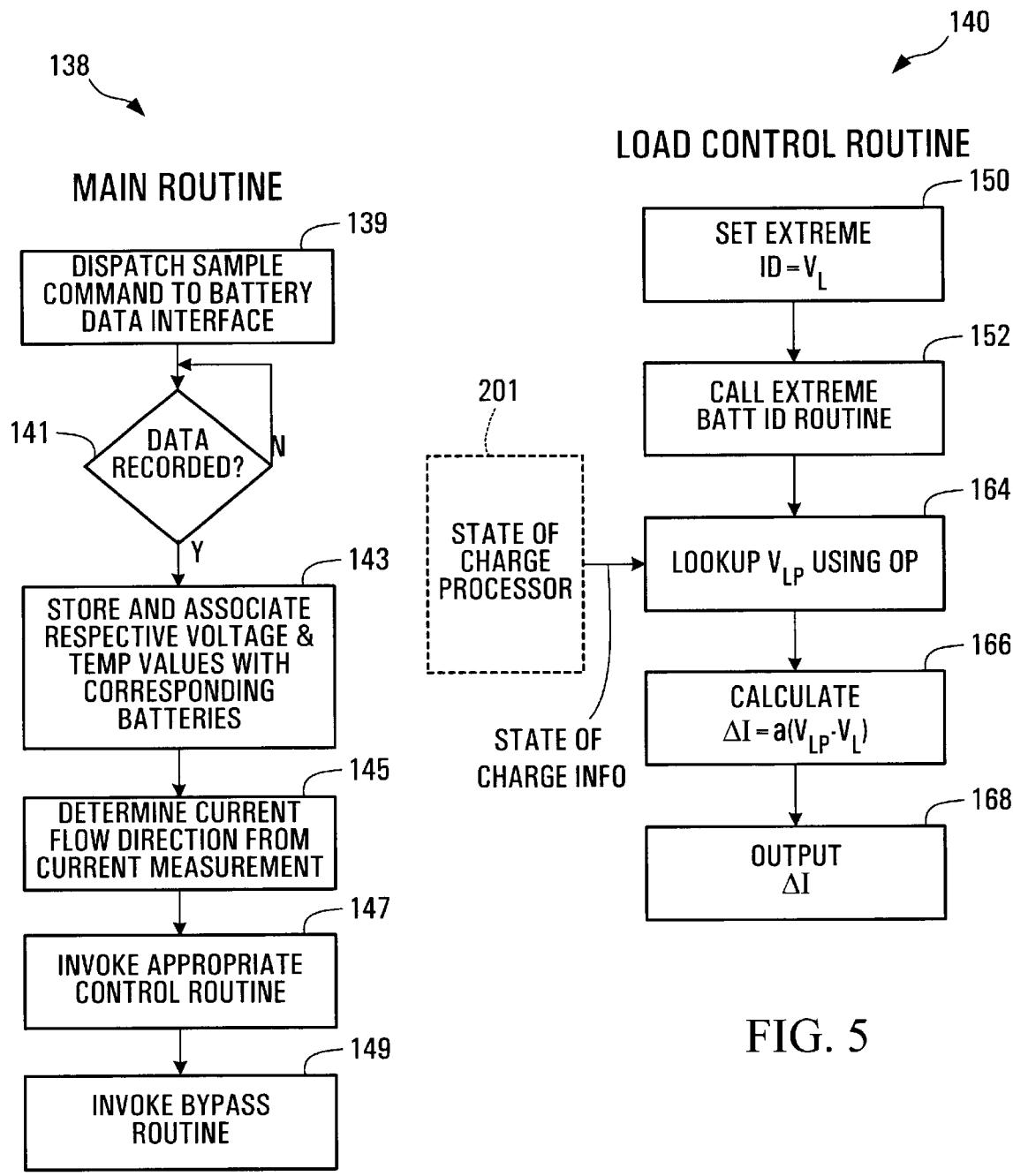
FIG. 4 is a flow chart showing a main routine executed by the processor circuit shown in FIG. 2.
FIG. 5 is a flow chart showing a load control routine executed by the processor circuit shown in FIG. 2.

Referring to FIGS. 1, 2 and 4 the main routine is shown generally at 138. The main routine 138 begins with a first block 139 that directs the main processor circuit 70 to dispatch a data request command to the battery data interface 36 shown in FIG. 1, to cause it to acquire voltage and temperature representations from the sensor units 28–34. Block 141 directs the main processor circuit 70 to wait for data to be returned from the battery data interface 36. As the data is returned, it may be stored, for example in a temporary storage area (not shown) in the RAM 74. If a representation of current direction is returned, it may be stored in the current direction field in the RAM 74, for example.

Block 143 of the main routine, in cooperation with the RAM 74 and processor circuit 70, acts as an associator for associating respective voltage and temperature representations with corresponding batteries.

When the requested data has been returned, block 143 directs the main processor circuit 70 to extract the voltage and temperature representations stored in temporary memory and store them in the operating parameter and voltage parameter arrays 90 and 92 shown in FIG. 3, such that these representations are associated with corresponding batteries. In the embodiment shown such association is achieved by storing temperature and battery id values as number pairs in the operating parameter array 90 and by storing voltage and battery id values as number pairs in the voltage parameter array 92. Alternatively, the operating parameter and voltage parameter values may be associated with corresponding batteries by storing both representations and the battery id for each battery in a separate record, for example. It will be appreciated that various other ways of associating these representations with batteries are possible and within the scope of this invention. Also, the intermediate step of storing the voltage and temperature values in temporary memory may be omitted with these values being stored directly in the indicated arrays with battery ids as they are received.

Block 145 then directs the main processor circuit 70 to determine the direction of current flow, from the current direction value returned from the battery data interface 36 and stored in the control parameter array 94 of the RAM 74.

Figure 6:
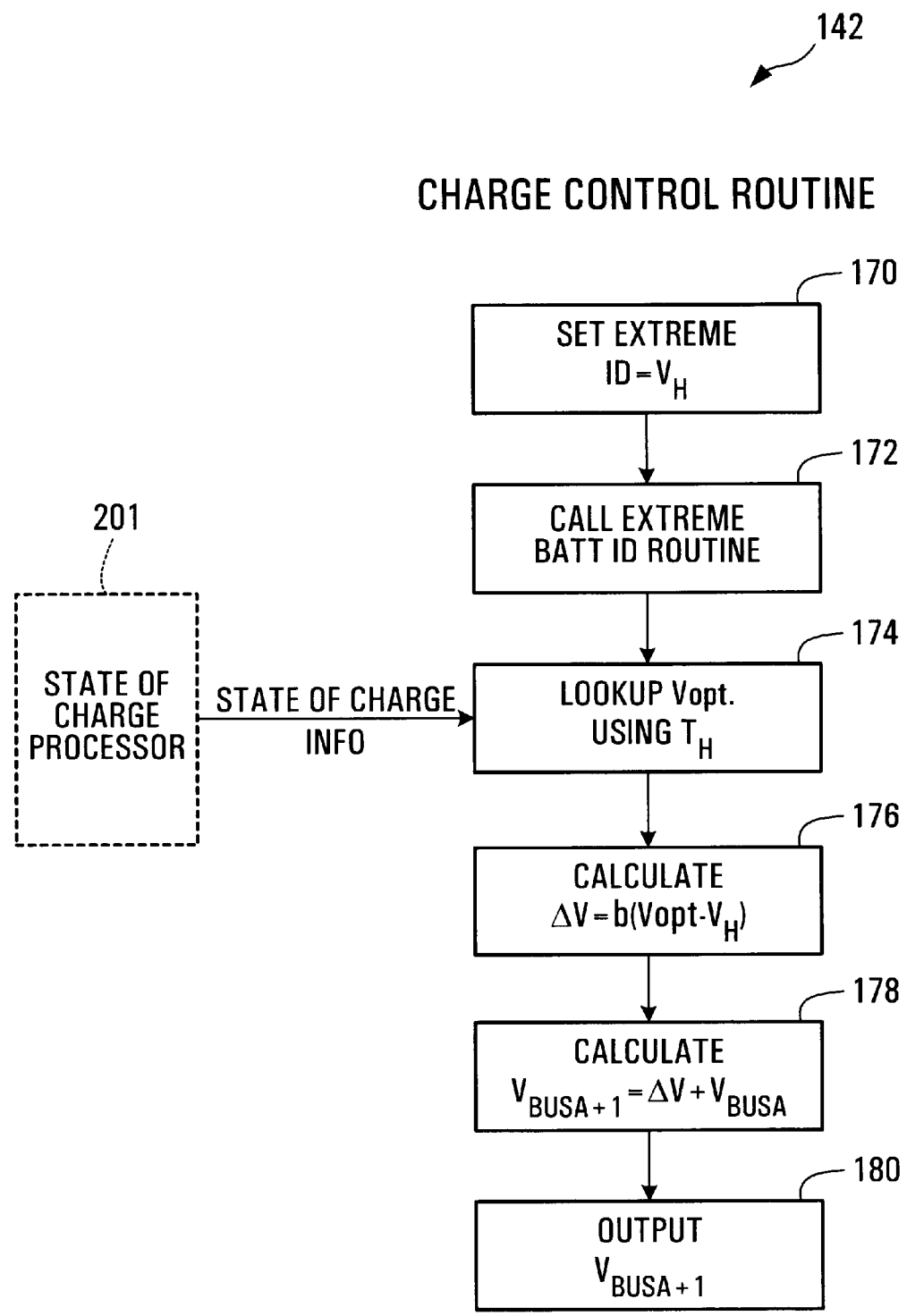
FIG. 6 is a flow chart of a charting control routine executed by the processor shown in FIG. 2.

Block 147 then directs the main processor circuit 70 to invoke the appropriate control routine, that is, the load control routine shown in FIG. 5 or the charge control routine shown in FIG. 6 depending on whether the current direction value indicates that current flow is to the energy bus 13 from the battery system 12 or to the battery system 12 from the energy bus 13, respectively. In the embodiment shown, when the current direction value indicates that energy is flowing from the battery system 12 to the energy bus 13, i.e., the battery system 12 is operating in the supply mode, the load control routine 140 shown in FIG. 5 is invoked to produce a current change signal. Similarly, in the embodiment shown, when the current direction value indicates that energy is flowing to the battery system 12 from the energy bus 13, i.e., the battery system is operating in the charge mode, the charge control routine 142 shown in FIG. 6 is invoked to produce a voltage change signal. Block 147 of the main routine 138, in conjunction with the main processor circuit 70 thus cooperate to act as an energy flow determiner operable to determine whether or not energy transfer is to the energy bus 13 or to the battery system 12.

Figure 8:
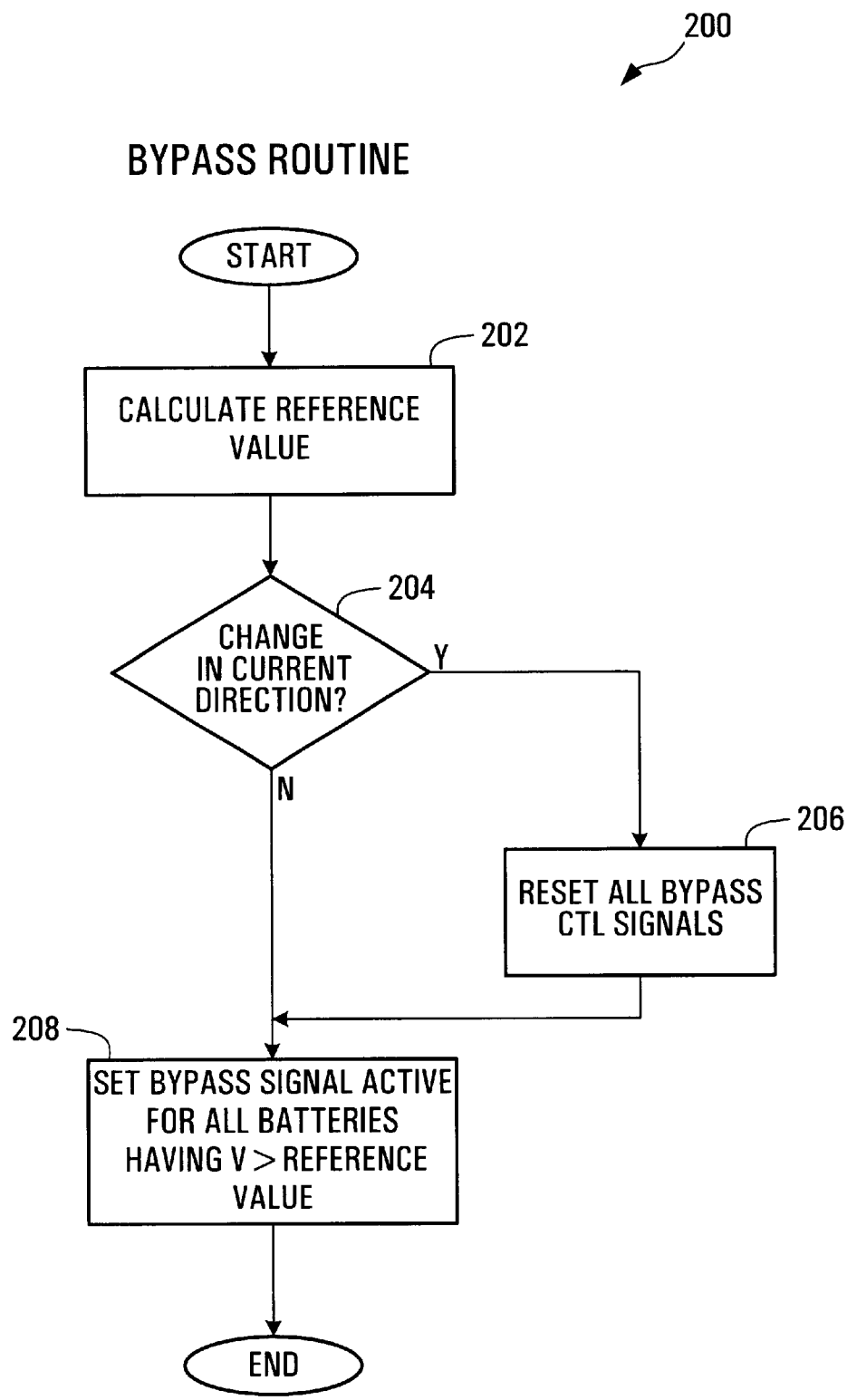
FIG. 8 is a flow chart of a bypass control routine executed by the processor circuit shown in FIG. 2.

Block 149 then directs the main processor circuit 70 to invoke the bypass routine shown in FIG. 8 to activate or de-activate bypass circuits 31, 33, 35 and 37 in certain sensor units.

Figure 7:
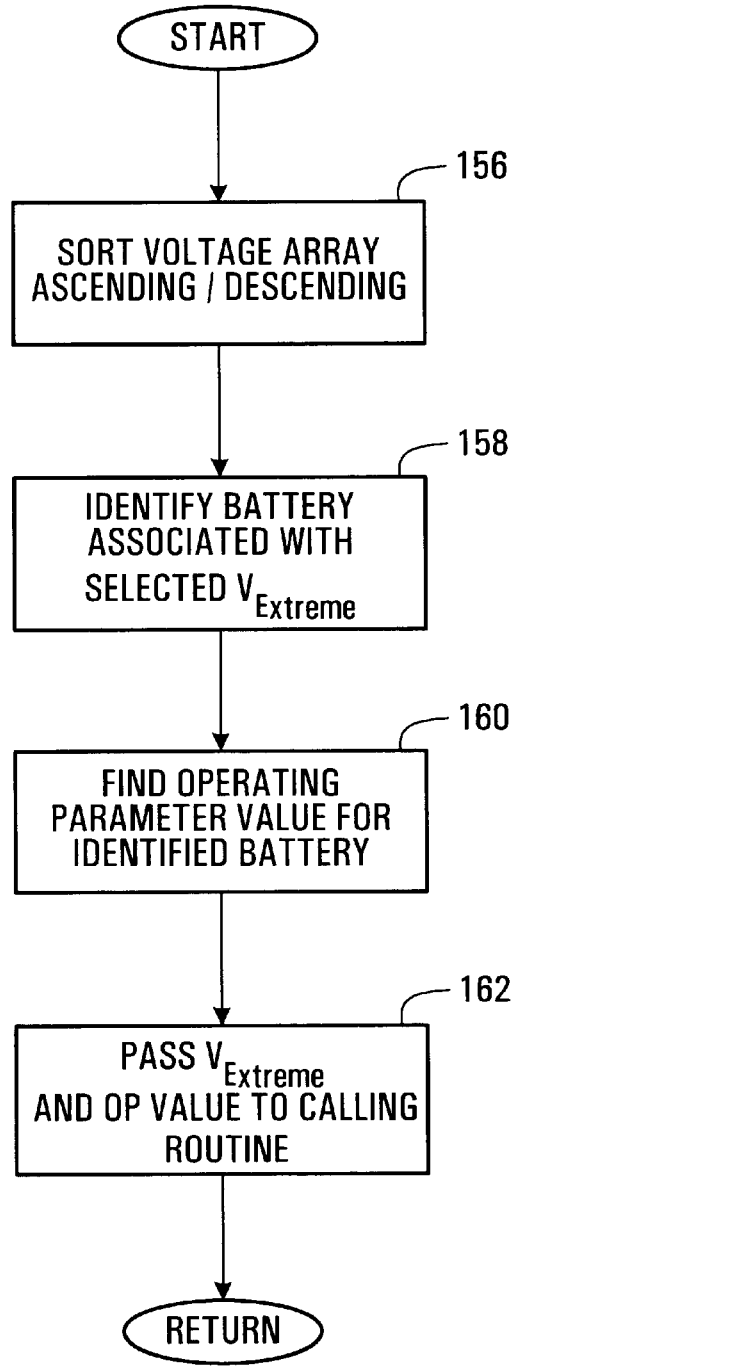
FIG. 7 is a flow chart of an voltage extremity processor routine executed by the processor shown in FIG. 2.

Referring to FIG. 5, the load control routine 140 is executed when energy is flowing from the battery system 12 to the energy bus 13 and begins by block 150 directing the processor to set active an extreme id flag (not shown) to indicate that the lowest voltage measured across any battery of the battery system 12 shown in FIG. 1 is to be taken as the extreme voltage for use in calculations. Block 152 then directs the main processor circuit 70 to call the voltage extremity processor routine shown at 144 in FIG. 7. Referring to FIGS. 2, 3 and 7, the voltage extremity processor routine 144 begins with a first block 156 which directs the main processor circuit 70 to access the voltage parameter array 92 to determine which of the voltage representations represents the extreme voltage, in this instance, the lowest voltage. To do this, block 156 acts as a sorter to sort the voltage parameter array 92 shown in FIG. 3 in ascending order. This causes the lowest measured voltage value to appear as the first value in the array. Next, block 158 directs the main processor circuit 70 to address the voltage parameter array 92 to read the battery identification associated with the lowest voltage value to identify the battery exhibiting the extreme voltage value. Block 160 then directs the main processor circuit 70 to act as a selector operable to select as the temperature representation for use by the reference voltage processor a temperature representation associated with a battery with which the extreme voltage is associated. To do this, the main processor circuit 70 finds the corresponding operating parameter value for the identified battery, by referring to the operating parameter array 90 using the battery identification associated with the lowest voltage value as an index into that array. On finding the corresponding operating parameter of the number pair associated with the identified battery, block 162 directs the main processor circuit to store the extreme voltage representation and the located operating parameter value in memory to enable it to be passed to the calling routine, in this instance, the load control routine 140.

Referring back to FIGS. 2, 3 and 5, armed with the extreme voltage value and the operating parameter value, block 164 of the load control routine 140 directs the main processor circuit 70 to act as the reference voltage processor 25 shown in FIG. 1 and use the operating parameter value received from the voltage extremity processor routine 144, i.e., temperature to find a corresponding lowest permissible voltage for the battery exhibiting the extreme voltage value. To do this, the main processor circuit 70 employs the lookup table interface 146 to access the minimum voltage table stored in the battery information non-volatile memory 76, using the operating parameter value (temperature) as an index to that table. This look-up causes a lowest permissible voltage value $V_{lp}$, which acts as a reference voltage, to be stored in memory, for access by the load control routine.

The lookup table interface 146 may direct the main processor circuit 70 to access the battery information non-volatile memory 76 configured as part of the processor circuit 51. It will be appreciated that the battery data memory need not be part of the processor circuit 51, but rather may be a remote memory device containing a database of the indicated tables. In this case, the lookup table interface may include further functions such as communications beyond what it might normally include where the battery data memory is directly accessible by the main processor circuit 70, for dealing with error correction and handshaking and the like. In general, the database containing the indicated tables may be located anywhere and the lookup table interface may include appropriate communications functions to gain access to the required tables.

Referring to FIG. 5, blocks 166 and 168 then direct the main processor circuit 70 to act as the accessor 27 and control signal generator 29 of FIG. 1. Block 166 directs the main processor circuit 70 to access the extreme voltage representation and the reference voltage representation stored in memory and to produce a control signal for use in changing the amount of energy transfer between the energy bus and the system in response to the representation of a reference voltage and the representation of the voltage extremity. To do this the main processor circuit 70 is directed to calculate a current change control value as the difference between the lowest permissible voltage value and the extreme voltage value multiplied by the load control constant (a) stored in the corresponding field 102 of the RAM 74. In doing so, the main processor circuit 70 acts as a difference processor operable to find a mathematical difference between the reference voltage and the extreme voltage. The main processor circuit 70 causes this mathematical difference to be multiplied by the load control constant (a) to produce a current change control signal indicative of a change in current drawn from the system. Block 168 then directs the main processor circuit 70 to cause this current change control value to be represented as a current change control signal at the output 88 shown in FIG. 2, for receipt by the load/charger device 18 shown in FIG. 1.

The effect of the load control routine 140 is to decrease the load on the battery system 12 when the voltage across any battery is below a minimum permissible battery voltage.

Referring to FIG. 6, the charge control routine 142 begins with a first block 170 that directs the main processor circuit 70 shown in FIG. 2 to set the extreme id flag to indicate that the highest voltage measured across any battery in the system is to be taken as the extreme voltage value. Then, block 172 directs the main processor circuit 70 to call the voltage extremity processor routine shown in FIG. 7 to obtain the extreme voltage representation and the output parameter representation and store these representations in memory, for access by the remainder of the charging control routine 142. It should be noted that at block 156 when the charging control routine calls the voltage extremity processor routine 144 shown in FIG. 7, the voltage parameter array 92 shown in FIG. 3 is sorted in descending order, to cause the first entry in the array to be the highest voltage value.

Referring back to FIG. 6, given the extreme voltage value and the operating parameter value associated with the battery exhibiting the extreme voltage value, block 174 directs the main processor circuit 70 to find an optimal charging voltage value using the operating parameter. This is done by causing the main processor circuit 70 to use the lookup table interface 146 to refer to the battery information non-volatile memory 76 and specifically the optimum voltage vs. temperature table stored therein, to find a corresponding optimal voltage value $V_{opt}$, using the operating parameter value (temperature) as an index to the table. Blocks 176, 178 and 180 then direct the main processor circuit 70 to act as the accessor 27 and control signal generator 29 shown in FIG. 1.

Block 176 then directs the main processor circuit 70 to access the extreme voltage representation and the reference voltage representation stored in memory and to produce a control signal for use in changing the amount of energy transfer between the energy bus and the system in response to the representation of a reference voltage and the representation of the voltage extremity. To do this the main processor circuit 70 is directed to calculate a voltage change value as a function of the difference between the optimal voltage value $V_{opt}$ and the extreme voltage value. In doing so, the main processor circuit 70 again acts as a difference processor operable to find a mathematical difference between the reference voltage and the extreme voltage. In this embodiment, the result produced by the action as a difference processor is multiplied by the charge control constant (b) stored in the corresponding field 104 in the RAM 74 shown in FIG. 3 to produce a voltage change value indicative of a desired change in voltage across the battery system 12.

Block 178 then directs the main processor circuit 70 to calculate a target bus voltage value as the sum of the voltage change value and the previous bus voltage value. The previous bus voltage value may be found by taking the sum of the voltage values stored in the voltage parameter array 92 shown in FIG. 3.

Block 180 then directs the main processor circuit 70 to cause this new bus voltage value to be represented as a signal at the output 86 shown in FIG. 2 for use by the load/charger device 18 shown in FIG. 1.

The effect of the charge control routine 142 is to decrease the main bus voltage, i.e., the total voltage impressed upon the battery system 12 until no battery in the system has a voltage higher than the highest optimal voltage permitted for any given battery.

Performance of the above system can be enhanced by selecting a lowest permissible voltage vs. temperature table and an optimum charge voltage table as a function of the state of charge of the battery exhibiting the voltage extremity. Thus, the lookup table interface 146 may provide access to a plurality of lowest permissible voltage vs. temperature tables and a plurality of optimum charge voltage vs. temperature tables, each associated with a different state of charge. The lookup table interface 146 may have an input operable to receive a representation of the state of charge of the battery and given such representation it can select the appropriate table accordingly.

Information about the state of charge of a battery in the battery system 12 can be obtained from a variety of sources including a routine such as shown at 201 in FIG. 2 operable to run on the main processor circuit 70 to gather information about the use of the battery, for example, and to produce a measure of the state of charge. For example, such a routine might keep track of the accumulated time and depth of discharge and the accumulated time and amount of charge and the temperatures at which these events occur and it might use one of the tables stored in the battery data memory to produce a percent discharge value. The above mentioned lookup tables may then be indexed by percent of discharge so that percent of discharge can be used by the lookup table interface to select an appropriate table for use in producing the reference voltage value. Thus, state of charge information may be an input to blocks 164 and 174 of FIGS. 5 and 6, respectively. A routine causing the main processor circuit 70 to perform a state of charge determination function may be regarded as a state of charge processor.

Alternatively, state of charge information may be received from an external source such as through the external communication interface, or through the user input, for example.

Referring to FIG. 8, the bypass routine 200 is the final routine called by the main routine 138 and directs the main processor circuit 70 to control the bypass circuits 31, 33, 35 and 37 on the sensor units 28, 30, 32 and 34, respectively, shown in FIG. 1. This provides for continuous balancing and equalization of energy flow from batteries in the battery system 12.

The bypass routine begins with a first block 202 that directs the main processor circuit 70 to calculate a reference value, such as the mean battery voltage, for example, from the voltage values stored in the voltage parameter array 92 shown in FIG. 3. This reference value is stored in the reference value field 98 of the memory structure shown in FIG. 3.

Block 204 then directs the main processor circuit 70 to determine whether or not there has been a change in current direction in the power system 10 and if so, to cause block 206 to direct the main processor circuit to issue bypass control signals to set all bypass circuits 31, 33, 35 and 37 inactive. The current direction is determined by reading the contents of the current direction field 106 in the control parameter array 94, shown in FIG. 3.

If there is no change in current direction since the last time the bypass routine 200 was run or after all bypass control signals have been set inactive, block 208 directs the main processor circuit 70 to set the bypass circuits active on all sensors associated with batteries having a voltage greater than the reference voltage. Over time, this has the effect of equalizing the voltage across each battery to approximately the same value. The bypass routine 200 is then ended.

The bypass routine has the effect of producing a bypass activation signal for activating a bypass circuit on any battery having a voltage greater than the reference value, when there is no change in the direction of current flow through the battery system. In addition, it causes a bypass circuit de-activation signal to be produced to de-activate a bypass circuit on any battery having an activated bypass circuit when there is a change in the direction of current flow in the system unless such battery has a voltage greater than the reference value of all battery voltages in the battery system, in which case the bypass circuit is not de-activated.

Effectively, using the system and methods described above, the voltage of any given battery relative to the voltage of other batteries in the battery system determines whether or not that battery is selected for more careful analysis based on an operating parameter of that battery. This operating parameter may be used to determine a reference voltage that is to be used in conjunction with the voltage of the selected battery to produce a control signal such as a current change signal and/or a voltage change signal that can be supplied to a controller of the load/charger device 18. Thus, the relative voltage performance of a battery and more particularly the extreme battery voltages of all batteries in the battery system are used to invoke the use of the operating conditions of the battery exhibiting the extreme voltage to determine how best to adjust the charge or discharge current of the entire battery system to optimize power transfer to or from the battery system as a whole.

While specific embodiments of the invention have been described and illustrated, such embodiments should be considered illustrative of the invention only and not as limiting the invention as construed in accordance with the accompanying claims.

What is claimed is:

1. A method of controlling energy transfer between an energy bus and a system of batteries, the method comprising:
   producing a control signal for use in changing the amount of energy transfer between the energy bus and the system of batteries in response to:
   a representation of a reference voltage determined from an operating parameter of a battery exhibiting a voltage extremity in the system of batteries; and
   a representation of said voltage extremity.

2. The method of claim 1 further comprising receiving said representation of said voltage extremity and receiving a representation of said operating parameter.

3. The method of claim 2 further comprising producing said representation of said voltage extremity.

4. The method of claim 3 wherein producing said representation of said voltage extremity comprises receiving representations of voltages of said batteries in the system of batteries.

5. The method of claim 4 further comprising determining which of said representations represents an extreme voltage among said representations of voltages.

6. The method of claim 5 wherein determining comprises sorting said representations of voltages.

7. The method of claim 3 further comprising producing said representation of said reference voltage.

8. The method of claim 7 wherein producing said representation of said reference voltage comprises receiving a representation of a temperature of said battery exhibiting said voltage extremity.

9. The method of claim 8 further comprising employing said temperature representation as an index to a look-up table relating reference voltages to temperature.

10. The method of claim 9 further comprising selecting said look-up table as a function of a state-of-charge of said battery having said voltage extremity.

11. The method of claim 10 further comprising receiving a representation of said state-of-charge.

12. The method of claim 11 further comprising producing said representation of said state of charge of said battery having said voltage extremity.

13. The method of claim 8 further comprising employing said temperature representation as an index to a lookup table relating optimal charging voltages to temperature.

14. The method of claim 8 further comprising employing said temperature representation as an index to a lookup table relating lowest permissible battery voltages to temperature.

15. The method of claim 8 further comprising producing said representation of temperature.

16. The method of claim 15 further comprising receiving a representation of voltage and a representation of temperature for each battery in the system.

17. The method of claim 16 further comprising associating respective said voltage and temperature representations with corresponding batteries.

18. The method of claim 17 further comprising selecting as said temperature representation for use in producing said representation of said reference voltage, a temperature representation associated with a battery with which said extreme voltage is associated.

19. The method of claim 1 further comprising producing said control signal as a function of a difference between said reference voltage and said voltage extremity.

20. The method of claim 1 wherein producing said control signal comprises producing a current change control signal indicative of a change in current available from the system of batteries.

21. The method of claim 20 further comprising producing said current change value as a function of a difference between said reference voltage and said voltage extremity.

22. The method of claim 1 wherein producing said control signal comprises producing a voltage change value indicative of a desired change in voltage to be applied to the system of batteries.

23. The method of claim 22 wherein producing said control signal comprises producing a target bus voltage control signal as a function of a previous target bus voltage value and said voltage change value.

24. The method of claim 1 further comprising determining whether or not energy transfer is to the energy bus or to the battery system and producing a current change signal when energy is flowing to the bus and producing a voltage change signal when energy is flowing to the battery system.

25. The method of claim 24 further comprising producing a bypass activation signal for activating a bypass circuit on any battery having a voltage greater than a reference value, when there is no change in the direction of current flow through the battery system.

26. The method of claim 1 further comprising producing a bypass circuit de-activation signal for de-activating a bypass circuit on any battery having an activated bypass circuit when there is a change in the direction of current flow in the batteries of the system unless said any battery has a voltage greater than the reference value.

27. An apparatus for controlling energy transfer between an energy bus and a system of batteries, the apparatus comprising:
   an accessor for accessing an extreme voltage representation representing a voltage of a battery exhibiting an extreme voltage among voltages of all batteries in the system and a reference voltage representation derived from an operating parameter associated with said battery exhibiting said extreme voltage; and a control signal generator in communication with said accessor and operable to produce a control signal for use in changing the amount of energy transfer between the energy bus and the system in response to said representation of a reference voltage and said extreme voltage representation.

28. The apparatus of claim 27 further comprising a voltage extremity processor operable to produce said extreme voltage representation.

29. The apparatus of claim 28 further comprising memory, accessible by said voltage extremity processor, for receiving and storing representations of voltages of the batteries in the system.

30. The apparatus of claim 29 wherein said voltage extremity processor is configured to determine which of said representations of voltages of the batteries in the system represents said extreme voltage.

31. The apparatus of claim 30 wherein said voltage extremity processor comprises a sorter operable to sort said representations of voltages of the batteries in the system.

32. The apparatus of claim 28 further comprising a reference voltage processor operable to produce said representation of said reference voltage.

33. The apparatus of claim 32 wherein said reference voltage processor is operable to receive a representation of a temperature of said battery exhibiting said extreme voltage.

34. The apparatus of claim 33 further comprising a look-up table interface operable to employ said temperature representation as an index to a look-up table relating reference voltage representations to temperature representations.

35. The apparatus of claim 34 wherein said lookup table interface is operable to select said lookup table as a function of a state-of-charge of the battery having said extreme voltage.

36. The apparatus of claim 35 wherein said lookup table interface includes an input operable to receive a representation of said state-of-charge.

37. The apparatus of claim 36 further comprising a state-of-charge processor operable to produce said representation of said state-of-charge.

38. The apparatus of claim 33 further comprising a lookup table interface operable to employ said temperature representation as an index to a lookup table relating optimal charging voltages to temperature.

39. The apparatus of claim 33 further comprising a lookup table interface operable to employ said temperature representation as an index to a lookup table relating lowest permissible battery voltages to temperature.

40. The apparatus of claim 33 further comprising a memory for receiving and storing a representation of voltage and a representation of temperature for each battery in the system.

41. The apparatus of claim 40 further comprising means for producing said representation of voltage and said representation of temperature for each battery in the system.

42. The apparatus of claim 41 wherein said means for producing comprises a battery data acquisition system.

43. The apparatus of claim 40 further comprising an associator operable to associate respective said voltage and temperature representations with corresponding batteries.

44. The apparatus of claim 43 further comprising a selector operable to select as said temperature representation for use by said reference voltage processor a temperature representation associated with a battery with which said extreme voltage is associated.

45. The apparatus of claim 27 wherein said control signal generator comprises a difference processor operable to find a mathematical difference between said reference voltage and said extreme voltage.

46. The apparatus of claim 27 wherein said control signal generator is operable to produce a current change control signal indicative of a change in current available from the system of batteries.

47. The apparatus of claim 27 wherein said control signal generator is operable to produce a voltage change value indicative of a desired change in voltage to be applied to the system of batteries.

48. The apparatus of claim 47 wherein said control signal generator is operable to produce a target bus voltage control signal as a function of a previous target bus voltage value and said voltage change value.

49. The apparatus of claim 27 further comprising an energy flow determiner operable to determine whether or not energy transfer is to the energy bus or to the battery system, said energy flow determiner cooperating with said control signal generator to cause said control signal generator to produce a current change signal when energy is flowing to the bus and to produce a voltage change signal when energy is flowing to the battery system.

50. The apparatus of claim 27 further comprising a bypass controller operable to produce a bypass activation signal for activating a bypass circuit on any battery having a voltage greater than a reference value, when there is no change in the direction of current flow through the battery system.

51. The apparatus of claim 50 wherein said bypass controller is operable to produce a bypass circuit de-activation signal for de-activating a bypass circuit on any battery having an activated bypass circuit when there is a change in the direction of current flow in the batteries of the system unless said any battery has a voltage greater than said reference value.

52. A computer readable medium encoded with codes for directing a processor circuit to control energy transfer between an energy bus and a system of batteries, by:

producing a control signal for use in changing the amount of energy transfer between the energy bus and the system of batteries in response to a representation of a reference voltage determined from an operating parameter of a battery exhibiting a voltage extremity and a representation of said voltage extremity.

53. A signal for transmitting codes for directing a processor circuit to control energy transfer between an energy bus and a system of batteries, the signal being encoded with codes for directing the processor circuit to produce a control signal for use in changing the amount of energy transfer between the energy bus and the system of batteries in response to a representation of a reference voltage determined from an operating parameter of a battery exhibiting a voltage extremity and a representation of said voltage extremity.

54. An apparatus for controlling energy transfer between an energy bus and a system of batteries, the apparatus comprising a processor circuit operable to produce a control signal for use in changing the amount of energy transfer between the energy bus and the system of batteries, in response to a representation of a reference voltage determined from an operating parameter of a battery exhibiting a voltage extremity and a representation of said voltage extremity.

55. An apparatus for controlling energy transfer between an energy bus and a system of batteries, the apparatus comprising:

means for accessing an extreme voltage representation representing a voltage of a battery exhibiting an extreme voltage among voltages of all batteries in the system;

means for accessing a representation of a reference voltage derived from an operating parameter associated with said battery exhibiting said extreme voltage; and means in communication with said means for accessing an extreme voltage representation and said means for accessing a representation of a reference voltage, for producing a control signal for use in changing the amount of energy transfer between the energy bus and the system in response to said representation of a reference voltage and said extreme voltage representation.

\* \* \* \* \*